US012378430B2

(12) United States Patent
Sim et al.

(10) Patent No.: US 12,378,430 B2
(45) Date of Patent: Aug. 5, 2025

(54) INK, MANUFACTURING METHOD OF DISPLAY DEVICE USING THE SAME, AND DISPLAY DEVICE

(71) Applicant: Samsung Display Co., LTD., Yongin-si (KR)

(72) Inventors: Jun Bo Sim, Yongin-si (KR); Duk Ki Kim, Yongin-si (KR); Hyo Jin Ko, Yongin-si (KR); Chang Hee Lee, Yongin-si (KR); Jae Kook Ha, Yongin-si (KR); Na Mi Hong, Yongin-si (KR); Jong Hyuk Kang, Yongin-si (KR); Won Ho Lee, Yongin-si (KR); Hyun Deok Im, Yongin-si (KR); Eun A Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 914 days.

(21) Appl. No.: 17/360,596

(22) Filed: Jun. 28, 2021

(65) Prior Publication Data

US 2022/0093818 A1 Mar. 24, 2022

(30) Foreign Application Priority Data

Sep. 22, 2020 (KR) .................. 10-2020-0122596

(51) Int. Cl.
*C09D 11/52* (2014.01)
*C09D 11/033* (2014.01)
(Continued)

(52) U.S. Cl.
CPC ............ *C09D 11/52* (2013.01); *C09D 11/033* (2013.01); *H01L 25/0753* (2013.01);
(Continued)

(58) Field of Classification Search
CPC ..... C09D 11/52; C09D 11/033; C09D 11/037; C09D 11/50; C09D 11/322; C09D 11/36; H01L 25/0753; H01L 33/62; H01L 2933/0033; H10H 20/84; H10H 29/03; H10H 29/142; H10H 29/37; H10H 29/49; H10H 29/922
See application file for complete search history.

(56) References Cited

U.S. PATENT DOCUMENTS 9,935,241 B2 * 4/2018 Do .................. H01L 27/156
10,026,777 B2 * 7/2018 Kang ................ H01L 27/15
(Continued)

FOREIGN PATENT DOCUMENTS

KR 10-1770632 8/2017
KR 10-2020-0088947 7/2020

*Primary Examiner* — Earl N Taylor
(74) *Attorney, Agent, or Firm* — KILE PARK REED & HOUTTEMAN PLLC

(57) ABSTRACT

An ink for manufacturing a display device includes a solvent; and light emitting elements disposed in the solvent, wherein the light emitting elements include a first semiconductor layer including a first type of semiconductor and a second semiconductor layer including a second type of semiconductor, and an electrical conductivity of the ink is about 1.5 μS/m or less. Also provided are a method of manufacturing a display device using the ink and a display device manufactured by the method.

19 Claims, 10 Drawing Sheets

(51) Int. Cl.
- H01L 25/075 (2006.01)
- H10H 20/84 (2025.01)
- H10H 29/03 (2025.01)
- H10H 29/14 (2025.01)
- H10H 29/37 (2025.01)
- H10H 29/49 (2025.01)
- H10H 29/80 (2025.01)

(52) U.S. Cl.
CPC ............ H10H 20/84 (2025.01); H10H 29/03 (2025.01); H10H 29/142 (2025.01); H10H 29/37 (2025.01); H10H 29/49 (2025.01); H10H 29/922 (2025.01)

(56) References Cited

U.S. PATENT DOCUMENTS

| | | | | |
|---|---|---|---|---|
| 10,269,865 | B2* | 4/2019 | Kang | H01L 27/15 |
| 10,607,968 | B2* | 3/2020 | Woo | H01L 33/62 |
| 10,665,633 | B2* | 5/2020 | Kang | H01L 25/0753 |
| 11,088,126 | B2* | 8/2021 | Heo | H01L 33/62 |
| 11,088,197 | B2* | 8/2021 | Kang | H01L 27/15 |
| 11,094,678 | B2* | 8/2021 | Woo | H01L 25/0753 |
| 11,211,534 | B2* | 12/2021 | Bae | H01L 33/0095 |
| 11,597,848 | B2* | 3/2023 | Sim | C09D 11/322 |
| 11,610,934 | B2* | 3/2023 | Kang | H01L 33/405 |
| 11,637,094 | B2* | 4/2023 | Heo | H01L 33/62 257/98 |
| 11,756,938 | B2* | 9/2023 | Woo | H01L 33/62 257/91 |
| 11,888,092 | B2* | 1/2024 | Jung | H01L 33/62 |
| 12,017,453 | B2* | 6/2024 | Kang | C09D 11/50 |
| 2007/0101899 | A1* | 5/2007 | Taguchi | C09D 11/40 106/31.27 |
| 2018/0175104 | A1* | 6/2018 | Kang | H01L 33/005 |
| 2018/0301504 | A1* | 10/2018 | Kang | H01L 33/005 |
| 2019/0096858 | A1* | 3/2019 | Woo | H01L 24/96 |
| 2019/0244559 | A1* | 8/2019 | Cho | G09G 3/32 |
| 2019/0245005 | A1* | 8/2019 | Kang | H01L 27/15 |
| 2020/0051962 | A1* | 2/2020 | Heo | H01L 27/1248 |
| 2020/0115569 | A1* | 4/2020 | Cagle | C09D 11/38 |
| 2020/0168678 | A1* | 5/2020 | Yoon | H10K 59/122 |
| 2020/0176656 | A1* | 6/2020 | Bae | H01L 25/0753 |
| 2020/0227392 | A1* | 7/2020 | Woo | H01L 25/0753 |
| 2020/0270474 | A1* | 8/2020 | Misawa | C09D 17/00 |
| 2020/0286947 | A1* | 9/2020 | Kang | F21K 9/68 |
| 2021/0269662 | A1* | 9/2021 | Sim | H10K 71/191 |
| 2021/0272938 | A1* | 9/2021 | Chang | H01L 25/0753 |
| 2021/0336142 | A1* | 10/2021 | Jeong | B41J 2/135 |
| 2021/0358898 | A1* | 11/2021 | Heo | H01L 27/1248 |
| 2021/0359166 | A1* | 11/2021 | Jung | H01L 33/005 |
| 2021/0366978 | A1* | 11/2021 | Kang | H01L 33/005 |
| 2021/0375836 | A1* | 12/2021 | Woo | H01L 24/96 |
| 2021/0391308 | A1* | 12/2021 | Sim | H01L 33/38 |
| 2021/0398956 | A1* | 12/2021 | Jung | C09D 11/322 |
| 2022/0013693 | A1* | 1/2022 | Cho | H01L 33/20 |
| 2022/0037559 | A1* | 2/2022 | Ko | H10K 71/15 |
| 2022/0068876 | A1* | 3/2022 | Do | H01L 33/0095 |
| 2022/0069158 | A1* | 3/2022 | Jung | C09D 11/322 |
| 2022/0069162 | A1 | 3/2022 | Do et al. | |
| 2022/0080725 | A1* | 3/2022 | Lee | B41J 2/2135 |
| 2022/0093818 | A1* | 3/2022 | Sim | C09D 11/50 |
| 2022/0102584 | A1* | 3/2022 | Kim | H01L 33/382 |
| 2022/0102604 | A1* | 3/2022 | Do | H01L 24/95 |
| 2022/0149244 | A1* | 5/2022 | Lee | H01L 33/005 |
| 2022/0231080 | A1* | 7/2022 | Li | H01L 25/0753 |
| 2022/0320365 | A1* | 10/2022 | Ryu | H01L 33/24 |
| 2022/0367756 | A1* | 11/2022 | Lee | H01L 33/44 |
| 2023/0145433 | A1* | 5/2023 | Kang | B41J 2/17596 347/85 |
| 2023/0150277 | A1* | 5/2023 | Lee | B41J 11/00216 347/102 |
| 2023/0231000 | A1* | 7/2023 | Kang | H01L 25/0753 313/498 |
| 2023/0256735 | A1* | 8/2023 | Hong | C09D 11/50 347/17 |

* cited by examiner

னnk, MANUFACTURING METHOD OF
DISPLAY DEVICE USING THE SAME, AND
DISPLAY DEVICE

CROSS-REFERENCE TO RELATED
APPLICATION

This application claims priority to and the benefits of Korean Patent Application No. 10-2020-0122596 under 35 U.S.C. § 119, filed in the Korean Intellectual Property Office on Sep. 22, 2020, the entire contents of which are incorporated herein by reference.

BACKGROUND OF THE INVENTION (a) Field of the Invention

The invention relates to an ink, a method of manufacturing a display device using the ink, and a display device manufactured according to the method.

(b) Description of the Related Art

As interest in information display technology is increasing, there have been and are being further research and development for improvement of display devices. Also, there has been a desire of improved methods of manufacturing the display devices.

SUMMARY

Embodiments have been made in an effort to provide an ink, a method of manufacturing a display device using the ink, and a display device manufactured by the method. A manufacturing process may be simplified in the method, and light emitting efficiency can be improved in the display device.

The objects of the invention are not limited to the objects mentioned above, and other technical objects that are not mentioned may be clearly understood to a person of an ordinary skill in the art using the following description.

An embodiment, an ink for manufacturing a display device may include a first solvent; and light emitting elements disposed in the first solvent, wherein the light emitting element may include a first semiconductor layer including a first type of semiconductor, and a second semiconductor layer including a second type of semiconductor different from the first type, and an electrical conductivity of the ink is about 1.5 μS/m or less.

The first solvent may include at least one of acetyltributylcitrate, tributyl citrate, tris acetate phosphate, ethyl phthalyl ethyl glycolate, propylene glycol phenyl ether, propylene glycol methyl ether acetate, butyl carbitol acetate, and decanol.

The ink may further include a second solvent different from the first solvent.

An electrical conductivity of the first solvent may be smaller than that of the ink, and an electrical conductivity of the second solvent is larger than that of the ink.

A dielectric constant of the ink may be about 8.0 or less.

An electrical conductivity of the ink may be about 1.0 μS/m or less.

An electrical conductivity of the ink may be about 0.8 μS/m or less.

When an electric field is applied to the light emitting element, external force may be applied to the first semiconductor layer of the light emitting element in a first direction, and external force may be applied to the second semiconductor layer of the light emitting element in a second direction opposite to the first direction.

Another embodiment provides a method of manufacturing a display device that may include preparing a substrate; forming a first electrode and a second electrode on the substrate; disposing ink between the first electrode and the second electrode, wherein the ink may include a first solvent including a light emitting element; and forming an electric field between the first electrode and the second electrode, wherein an electrical conductivity of the ink may be about 1.5 μS/m or less.

In the forming of the electric field, the light emitting element may be arranged between the first electrode and the second electrode.

The light emitting element may include a first semiconductor layer disposed adjacent to a first end portion of the light emitting element and a second semiconductor layer disposed adjacent to a second end portion of the light emitting element, and a polarity of the light emitting element at the first end portion may be different from a polarity of the light emitting element at the second end portion.

In the forming of the electric field, external force toward a first electrode may be applied to the first end portion, and external force toward the second electrode may be applied to the second end portion.

In the forming of the electric field, the light emitting element may rotate so that the first end portion faces to the first electrode and the second end portion faces to the second electrode in a plan view.

The light emitting element may include at least one first light emitting element and at least one second light emitting element; in the forming of the electric field, the first end portion of the at least one first light emitting element may correspond to the first electrode, the second end portion of the at least one first light emitting element may correspond to the second electrode, the first end portion of the at least one second light emitting element may correspond to the second electrode, and the second end portion of the at least one second light emitting element may correspond to the first electrode; and a number of the at least one first light emitting elements may be larger than a number of the at least one second light emitting element.

A ratio of the at least one first light emitting element to the light emitting element may be about 0.6 or more.

The first solvent may include at least one of acetyltributylcitrate, tributyl citrate, tris acetate phosphate, ethyl phthalyl ethyl glycolate, propylene glycol phenyl ether, propylene glycol methyl ether acetate, butyl carbitol acetate, and decanol.

The ink may further include a second solvent different from the first solvent, an electrical conductivity of the first solvent may be smaller than the electrical conductivity of the ink, and an electrical conductivity of the second solvent may be larger than the electrical conductivity of the ink.

An electrical conductivity of the ink may be about 1.0 μS/m or less.

The method of manufacturing the display device may further include removing the first solvent after the forming of the electric field.

Another embodiment provides a display device manufactured according to the method of manufacturing the display device.

The embodiments of the invention are not limited to the above-described embodiments.

Also, the effects of the invention are not limited to the above-described effects. Any effects not mentioned herewith will be clearly understood by a person of ordinary skill in the art from the disclosure and the accompanying drawings.

DETAILED DESCRIPTION OF THE EMBODIMENTS

Figure 1:
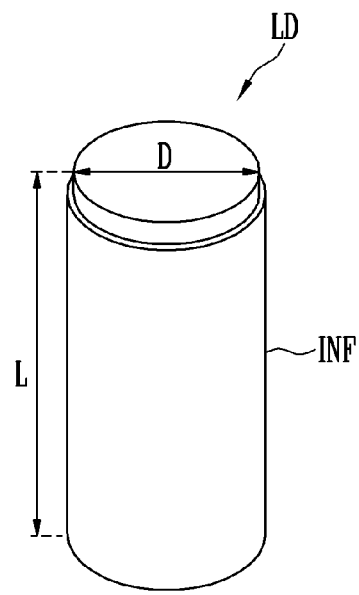
FIG. 1 and FIG. 2 illustrate a perspective view and a schematic cross-sectional view, respectively, of a light emitting element according to an embodiment.

Since the embodiments described in the specification are intended to clearly explain the concept of the invention to a person of ordinary skill in the art, the invention is not limited to the embodiments described in the specification, and it will be construed by a person of ordinary skill in the art that various modifications and changes may be made without departing from the spirit and scope of the invention.

The terms used in the specification are selected as general terms that are currently widely used in consideration of the functions in the invention, but these may vary according to the intention of a person of ordinary skill in the art to which the invention belongs, practice, or new technologies. However, when a specific term is defined and used in an arbitrary meaning unlike this, the meaning of the term will be separately described. Therefore, the terms used in the specification should be construed based on the actual meaning of the term and the overall contents of the specification, not the nominal name of the term.

The accompanying drawings are provided in order to allow embodiments disclosed in the specification to be easily understood, and the shapes shown in the drawings may be exaggerated and displayed as necessary to aid understanding of the invention, so that the invention is not limited to the drawings.

In describing the embodiments of the invention, a detailed description of pertinent known configurations or functions may be omitted as necessary if it is deemed to make the gist of the invention unnecessarily vague.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

Spatially relative terms, such as "beneath," "below," "under," "lower," "above," "upper," "over," "higher," "side" (for example, as in "sidewall"), and the like, may be used herein for descriptive purposes, and, thereby, to describe one or an elements' relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features may then be oriented "above" the other elements or features. Thus, the example term "below" can encompass both an orientation of above and below. Furthermore, the apparatus may be otherwise oriented (for example, rotated 90 degrees or at other orientations), and, as such, the spatially relative descriptors used herein interpreted accordingly.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "have" and/or "having" and their variations when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

The invention relates to an ink, a manufacturing method of a display device using the ink, and a display device using the ink.

Hereinafter, embodiments of an ink, a method of manufacturing a display device using the ink, and a display device manufactured according to the method will be described with reference to FIG. 1 to FIG. 11.

Figure 2:
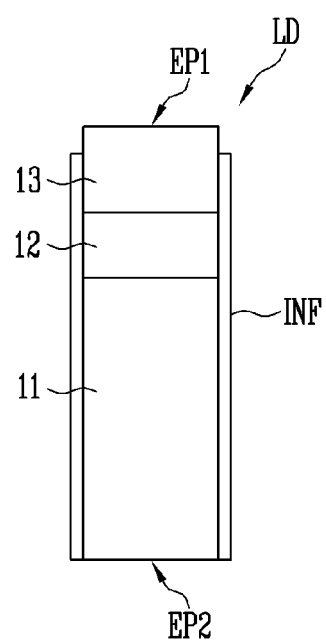

FIG. 1 and FIG. 2 illustrate a perspective view and a schematic cross-sectional view of a light emitting element according to an embodiment, respectively. FIG. 1 and FIG. 2 illustrate a cylindrical shape light emitting element LD, but a type and/or shape of the light emitting element LD is not limited thereto.

Referring to FIG. 1 and FIG. 2, the light emitting element LD may include a first semiconductor layer 11 and a second semiconductor layer 13, and an active layer 12 interposed between the first and second semiconductor layers 11 and 13. For example, the light emitting element LD may include the first semiconductor layer 11, the active layer 12, and the second semiconductor layer 13 sequentially stacked along a length direction of the light emitting element LD. The length direction may refer to an extending direction of the light emitting element LD.

The light emitting element LD may be provided to have a cylindrical shape extending along one direction. The light emitting element LD may have a first end portion EP1 and a second end portion EP2. One of the first and second semiconductor layers 11 and 13 may be disposed on the first end portion EP1 of the light emitting element LD. The remaining one of the first and second semiconductor layers 11 and 13 may be disposed on the second end portion EP2 of the light emitting element LD.

In some embodiments, the light emitting element LD may include a light emitting element manufactured in a cylindrical shape through an etching method or the like. In the specification, the "cylindrical shape" includes a rod-like shape or bar-like shape (that is, with an aspect ratio greater than 1) that is long in the length direction, such as a circular cylinder or a polygonal cylinder, but a shape of a cross-section thereof is not limited thereto. For example, the length L of the light emitting element LD may be larger than a diameter D thereof (or a width of a lateral cross-section thereof).

The light emitting element LD may have a size as small as a nanometer scale to a micrometer scale. For example, the light emitting element LD may each have the diameter D (or width) and/or the length L ranging from a nano scale to a micro scale. However, the size of the light emitting element LD is not limited thereto, and the size of the light emitting element LD may be variously changed according to design conditions of various devices, for example, a display device employing a light emitting device using the light emitting element LD as a light source.

The first semiconductor layer 11 may be a first conductive semiconductor layer. For example, the first semiconductor layer 11 may include an N-type semiconductor layer. For example, the first semiconductor layer 11 may include semiconductor material of at least one of In—AlGaN, GaN, AlGaN, InGaN, AlN, and InN, and may include an N-type semiconductor layer doped with a first conductive dopant such as Si, Ge, Sn, or the like. However, the material included in the first semiconductor layer 11 is not limited thereto, and the first semiconductor layer 11 may include various materials.

The active layer 12 is disposed on the first semiconductor layer 11, and may have a single-quantum or multi-quantum well structure. A position of the active layer 12 may be variously changed according to a type of the light emitting element LD.

A clad layer (not shown) doped with a conductive dopant may be formed at an upper portion and/or a lower portion of the active layer 12. For example, the clad layer may include an AlGaN layer or an InAlGaN layer. In some embodiments, a material such as AlGaN and InAlGaN may be used to form the active layer 12, and various materials may form the active layer 12.

The second semiconductor layer 13 is disposed on the active layer 12, and may include a semiconductor layer of a type different from that of the first semiconductor layer 11. For example, the second semiconductor layer 13 may include a P-type semiconductor layer. For example, the second semiconductor layer 13 may include at least one semiconductor material of InAlGaN, GaN, AlGaN, InGaN, AlN, and InN, and may include a P-type semiconductor layer doped with a second conductive dopant such as Mg. However, the material included in the second semiconductor layer 13 is not limited thereto, and the second semiconductor layer 13 may include various materials.

When a threshold voltage or more is applied to respective ends of the light emitting element LD, the light emitting element LD emits light while electron-hole pairs are combined in the active layer 12. By controlling the light emission of the light emitting element LD by using this principle, the light emitting element LD may be used as a light source for various light emitting devices in addition to pixels of a display device.

The light emitting element LD may further include an insulating film INF provided on a surface thereof. The insulating film INF may be formed on the surface of the light emitting element LD so as to surround at least an outer circumferential surface of the active layer 12, and may further surround one region of the first and second semiconductor layers 11 and 13.

In some embodiments, the insulating film INF may expose respective end portions of the light emitting element LD having different polarities. For example, the insulating film INF may expose one end of each of the first and second semiconductor layers 11 and 13 disposed at the first and second end portions EP1 and EP2 of the light emitting element LD. In another embodiment, the insulating film INF may expose side portions of the first and second semiconductor layers 11 and 13 adjacent to the first and second end portions EP1 and EP2 of the light emitting element LD having different polarities.

In some embodiments, the insulating film INF may have a single layer or multilayer (for example, a double layer including an aluminum oxide (AlOx) and a silicon oxide (SiOx)) by including at least one insulating material of a silicon oxide (SiOx), a silicon nitride (SiNx), a silicon oxynitride (SiOxNy), an aluminum oxide (AlOx), and a titanium oxide (TiOx), but the structure and/or the material of the insulating film INF is not limited thereto. In some embodiments, the insulating film INF may be omitted.

When the insulating film INF covers a surface of the light emitting element LD, for example, an external circumferential surface of the active layer 12, the active layer 12 may be prevented from being short-circuited with a first pixel electrode or a second pixel electrode to be described later. Accordingly, electrical stability of the light emitting element LD may be secured.

When the insulating film INF is provided on the surface of the light emitting element LD, life-span and efficiency thereof may be increased by reducing surface defects of the light emitting element LD. An unwanted short circuit between the light emitting elements LD may be prevented even when the light emitting elements LD are disposed in close contact with each other.

In the embodiment, the light emitting element LD may further include an additional element in addition to the first semiconductor layer 11, the active layer 12, the second semiconductor layer 13, and/or the insulating film INF surrounding the first semiconductor layer 11, the active layer 12, and the second semiconductor layer 13. For example, the light emitting element LD may additionally include one or more of a phosphor layer, an active layer, a semiconductor layer, and/or an electrode layer disposed on one end side of the first semiconductor layer 11, the active layer 12, and/or the second semiconductor layer 13. For example, a contact electrode may be disposed at the first and second end portions EP1 and EP2 of the light emitting element LD, respectively. Although FIGS. 1 and 2 illustrate the light emitting element LD having a cylindrical shape, the type, structure, and/or shape of the light emitting element LD may be variously changed. For example, the light emitting element LD may have a core-shell structure having a polygonal horn shape.

A light emitting device including the light emitting element LD described above may be used in various types of devices having a light source in addition to a display device. For example, light emitting elements LD may be disposed in each pixel of a display panel, and the light emitting elements LD may be used as a light source of each pixel. However, an application field of the light emitting element LD is not limited to the above-described example. For example, the light emitting element LD may be used in other types of devices having a light source, such as a lighting device.

Figure 3:
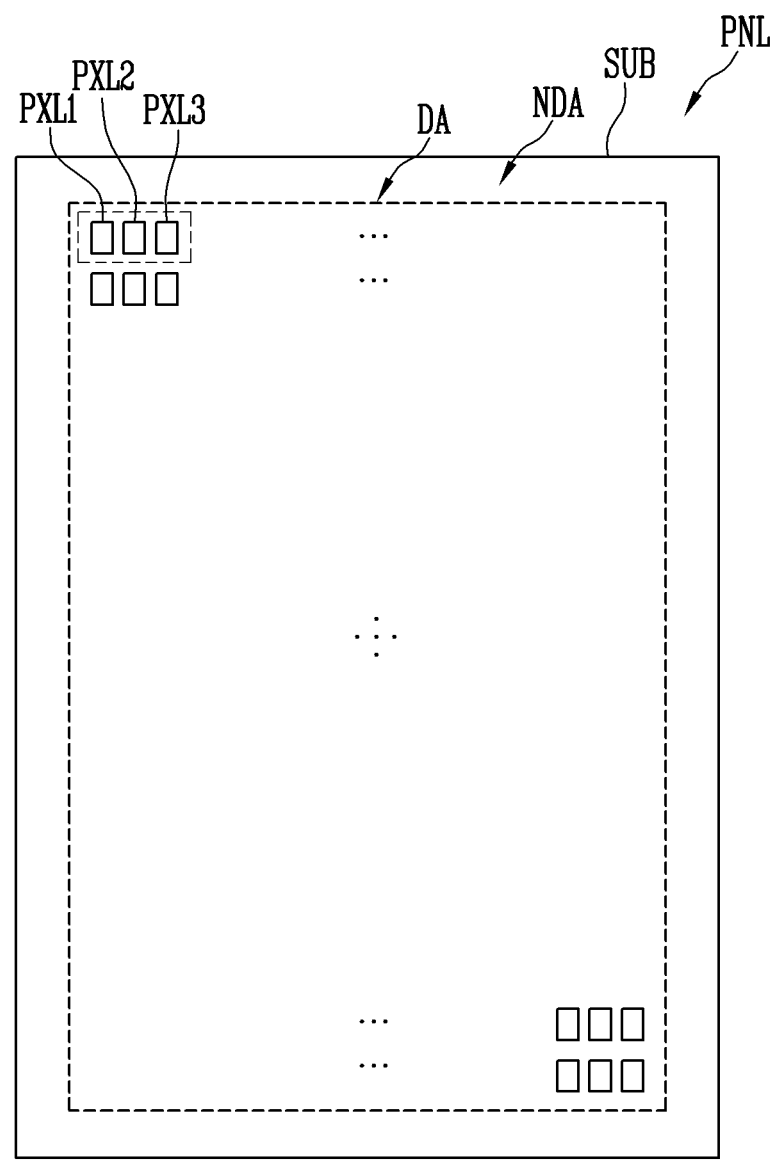
FIG. 3 illustrates a schematic top plan view of a display device according to an embodiment.

FIG. 3 illustrates a top plan view of a display device according to an embodiment.

FIG. 3 illustrates a display device, in particular, a display panel PNL provided in the display device as an example of an electronic device that may use the light emitting element LD described in the embodiments of FIG. 1 to FIG. 2 as a light source.

Each pixel unit PXU of the display panel PNL and each pixel forming the pixel unit PXU may include at least one light emitting element LD. For convenience, FIG. 3 briefly illustrates a structure of the display panel PNL based on a display area DA. However, in some embodiments, at least one driving circuit portion (for example, at least one of a scan driver and a data driver), wires, and/or pads, which are not shown, may be further disposed in the display panel PNL.

Referring to FIG. 3, the display panel PNL may include a substrate SUB and the pixel unit PXU disposed on the substrate SUB. The pixel unit PXU may include a first pixel PXL1, a second pixel PXL2, and/or a third pixel PXL3. Hereinafter, when arbitrarily referring to at least one of the first pixel PXL1, the second pixel PXL2, and the third pixels PXL, or when comprehensively referring to two or more thereof, the pixels will be referred to as a "pixel PXL" or "pixels PXL".

The substrate SUB corresponds to a base member of the display panel PNL, and may include a rigid or flexible substrate or film. For example, the substrate SUB may correspond to a hard substrate including glass or tempered glass, a flexible substrate (or a thin film) including a plastic or metallic material, or an insulation layer having at least one layer. The material and/or physical properties of the substrate SUB are not limited thereto.

In the embodiment, the substrate SUB may be substantially transparent, and "substantially transparent" may mean that light may be transmitted at a predetermined (or specific) transmittance or more. In another embodiment, the substrate SUB may be translucent or opaque. In addition, the substrate SUB may include a reflective material according to an embodiment.

The display panel PNL and the substrate SUB forming the display panel include a display area DA for displaying an image and a non-display area NDA excluding the display area DA.

The pixels PXL may be disposed in the display area DA. In the non-display area NDA, various wires electrically connected to the pixels PXL of the display area DA, pads, and/or internal circuit parts may be disposed. The pixels PXL may be regularly arranged according to a stripe or PenTile® arrangement structure. However, the arrangement structure of the pixels PXL is not limited thereto, and the pixels PXL may be arranged in the display area DA in various structures and/or methods.

In some embodiments, two or more types of pixels PXL emitting light of different colors may be disposed in the display area DA. For example, in the display area DA, the first pixels PXL1 emitting light of a first color, the second pixels PXL2 emitting light of a second color, and the third pixels PXL3 emitting light of a third color may be arranged. At least one of the first to third pixels PXL1, PXL2, and PXL3 disposed to be adjacent to each other may form one pixel unit PXU that may emit light of various colors. For example, each of the first to third pixels PXL1, PXL2, and PXL3 may correspond to a sub-pixel emitting light of a predetermined color. In some embodiments, the first pixel PXL1 may correspond to a red pixel that emits red light, the second pixel PXL2 may correspond to a green pixel that emits green light, and the third pixel PXL3 may correspond to a blue pixel that emits blue light, but the colors of the lights from the first to third pixels PXL1, PXL2, and PXL3 are not limited thereto.

In the embodiment, the first pixel PXL1, the second pixel PXL2, and the third pixel PXL3 include a first color light emitting element, a second color light emitting element, and a third color light emitting element as a light source, respectively, so that they respectively emit light of the first color, the second color, and the third color. In another embodiment, the first pixel PXL1, the second pixel PXL2, and the third pixel PXL3 may include light emitting elements of substantially the same color, and include color conversion layers and/or color filters of different colors disposed on respective light emitting elements, so that the light emitting elements may emit light of the first color, the second color, and the third color, respectively. However, the color, type, and/or number of pixels PXL forming each pixel unit PXU are not limited thereto. The color of light emitted by each pixel PXL may be variously changed.

The pixel PXL may include at least one light source driven by a control signal (for example, a scan signal and a data signal) and/or a power source (for example, a first power source and a second power source). In the embodiment, the light source may include at least one light emitting element LD according to one of the embodiments of FIG. 1 and FIG. 2, for example, ultra-small cylindrical shaped light emitting elements LD having a size as small as nanometer scale to micrometer scale. However, the type of the light emitting element LD is not limited thereto, and various types of light emitting elements LD may be used as a light source of the pixel PXL.

In the embodiment, each pixel PXL may serve as an active pixel. However, the type, structure, and/or driving method of pixels PXL that may be applied to the display device are not limited thereto. For example, each pixel PXL may serve as a pixel of a passive or active light emitting display device of various structures and/or driving methods.

Figure 4:
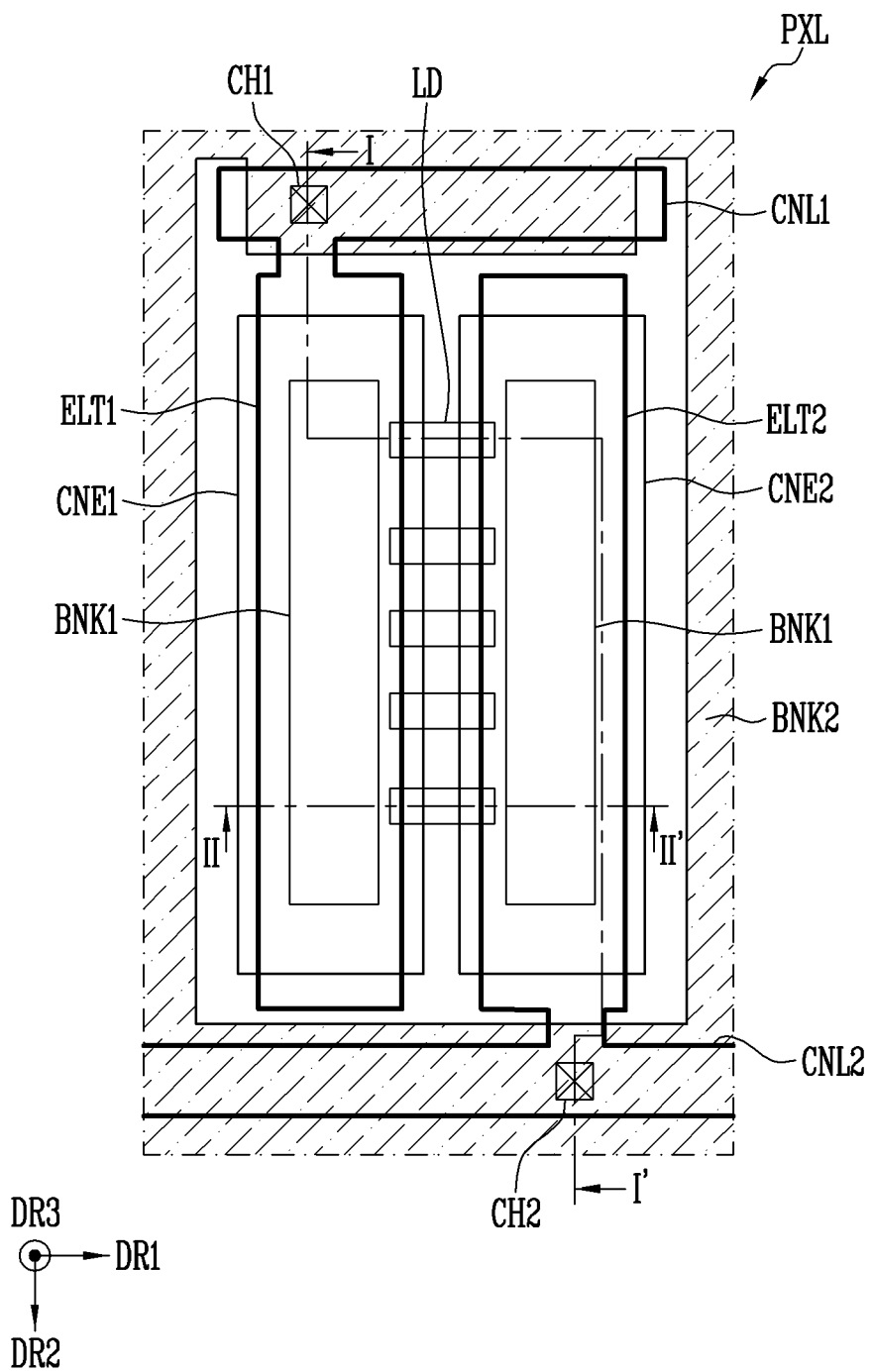
FIG. 4 illustrates a schematic top plan view of each pixel of a display device according to an embodiment.

FIG. 4 illustrates a schematic top plan view of each pixel of a display device according to an embodiment. In FIG. 4, a transistor T (see FIG. 5) electrically connected to the light emitting element LD and signal lines electrically connected to the transistor T are omitted for convenience.

Referring to FIG. 4, the pixel PXL may include light emitting elements LD. The light emitting elements LD may be arranged between a first electrode ELT1 and a second electrode ELT2 so that a length direction of the light emitting element LD is substantially parallel to a first direction DR1. The light emitting elements LD may be arranged between the first electrode ELT1 and the second electrode ELT2. The light emitting elements LD may be disposed (for example, dispersed) in a solvent SLV (see FIG. 7).

The pixel PXL may include electrodes. The electrodes may apply an electrical signal to the light emitting element LD so that the light emitting element LD may emit light. At least some of the electrodes may function as an alignment electrode that may form an electric field to align the light emitting elements LD.

The electrodes may include the first electrode ELT1 and the second electrode ELT2. The first electrode ELT1 provided to each pixel PXL may be separated from the first electrode ELT1 provided to the adjacent pixel PXL. The second electrode ELT2 may function as a common electrode for the pixels PXL arranged along one direction, but is not limited thereto.

The first electrode ELT1 may be electrically connected to the transistor T of the pixel PXL through a first contact hole CH1, and the second electrode ELT2 may be electrically connected to a power line PL (see FIG. 5) through a second contact hole CH2.

The first electrode ELT1 may be branched from a first connection wire CNL1 extending in the first direction DR1. The first connection wire CNL1 and the first electrode ELT1 may be integral with each other. The first connection wire CNL1 may correspond to at least a partial region of the first electrode ELT1.

The first connection wire CNL1 may be physically spaced apart from the first connection wire CNL1 of the adjacent pixel PXL in one direction so that each pixel PXL may be individually or independently driven after the light emitting elements LD are arranged.

The second electrode ELT2 may be branched from a second connection wire CNL2 extending in the first direction DR1. The second connection wire CNL2 and the first electrode ELT2 may be integral with each other. The second connection wire CNL2 may correspond to at least a partial region of the second electrode ELT2.

In the embodiment, the first electrode ELT1 may correspond to an anode electrode, and the second electrode ELT2 may correspond to a cathode electrode.

The light emitting element LD may be disposed between the first electrode ELT1 and the second electrode ELT2. An end of the light emitting element LD may be electrically connected to the first electrode ELT1, and another end of the light emitting element LD may be electrically connected to the second electrode ELT2.

The light emitting elements LD are spaced apart from each other in a second direction DR2, and may be arranged to be substantially parallel to each other between the first electrode ELT1 and the second electrode ELT2. The second direction DR2 may be different from (for example, opposite to) the first direction DR1. Some of the light emitting elements LD may be disposed to be adjacent to each other to form a group, and some of the light emitting elements LD may be spaced apart from each other at a distance to form a group. The light emitting elements LD may have a non-uniform density, and may be aligned and arranged in one direction.

The pixel PXL may include a first contact electrode CNE1 and a second contact electrode CNE2. At least a portion of the first contact electrode CNE1 may be disposed on the first electrode ELT1, and another at least a portion of the first contact electrode CNE1 may be positioned on an end portion of the light emitting element LD. At least a portion of the second contact electrode CNE2 may be disposed on the second electrode ELT2, and another at least a portion of the second contact electrode CNE2 may be positioned on another end portion of the light emitting element LD.

Figure 5:
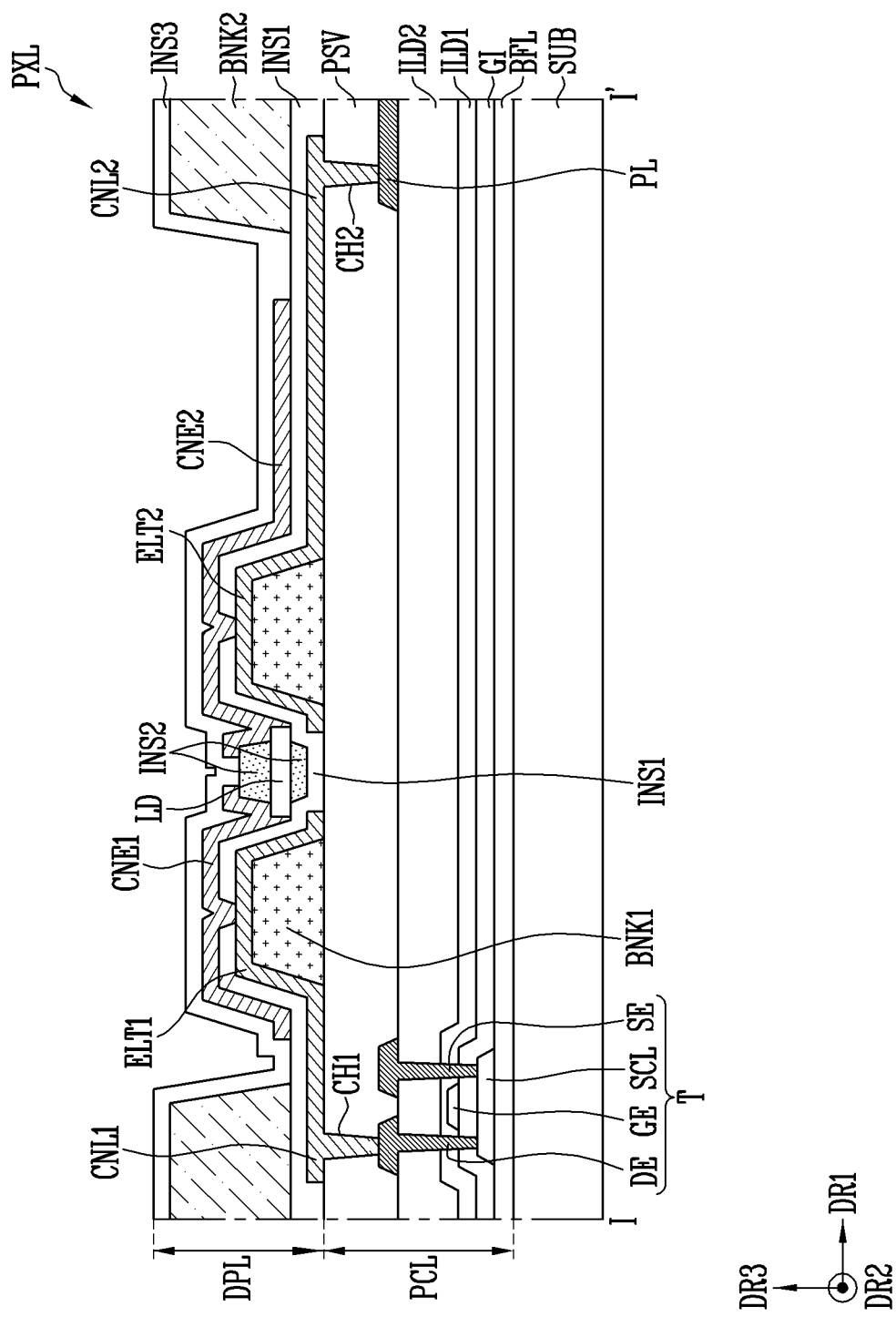
FIG. 5 illustrates a schematic cross-sectional view taken along line I-I' of FIG. 4.

Hereinafter, a description will be given focusing on a stacked structure of each pixel PXL with reference to FIG. 5. FIG. 5 illustrates a schematic cross-sectional view taken along line I-I' of FIG. 4.

Referring to FIG. 5, the pixel PXL may include the substrate SUB, a pixel circuit portion PCL, and a display element portion DPL.

The substrate SUB may include a rigid or flexible substrate. For example, the substrate SUB may include a rigid material or a flexible material. According to the embodiment, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, cellulose triacetate, and cellulose acetate propionate. However, the material of the substrate SUB applied to the embodiment of the invention is not limited to a specific example.

The pixel circuit portion PCL may include a buffer film BFL, a transistor T, a gate insulating film GI, a first interlayer insulating film ILD1, a second interlayer insulating film ILD2, a power line PL, a first contact hole CH1, a second contact hole CH2, and a passivation layer PSV.

The buffer film BFL may be disposed on the substrate SUB. The buffer film BFL may prevent impurities from being diffused from the outside. The buffer film BFL may include at least one of metal oxides such as a silicon nitride (SiNx), a silicon oxide (SiOx), a silicon oxynitride (SiOxNy), and an aluminum oxide (AlOx).

The transistor T may include a thin film transistor. According to the embodiment, the transistor T may correspond to a driving transistor among thin film transistors. The transistor T may include a semiconductor layer SCL, a gate electrode GE, a source electrode SE, and a drain electrode DE.

The semiconductor layer SCL may be disposed on the buffer film BFL. The semiconductor layer SCL may include at least one of polysilicon, amorphous silicon, and an oxide semiconductor.

The semiconductor layer SCL may include a first contact region contacting the source electrode SE and a second contact region contacting the drain electrode DE.

The first contact region and the second contact region may correspond to a semiconductor pattern doped with an impurity. A region between the first contact region and the second contact region may include a channel region. The channel region may correspond to an intrinsic semiconductor pattern in which no impurity is doped.

The gate insulating film GI may be provided on the semiconductor layer SCL. The gate insulating film GI may include an inorganic material. According to the embodiment, the gate insulating film GI may include at least one of a silicon nitride (SiNx), a silicon oxide (SiOx), a silicon oxynitride (SiOxNy), and an aluminum oxide (AlOx). In some embodiments, the gate insulating film GI may include an organic material.

The gate electrode GE may be disposed on the gate insulating film GI. A position of the gate electrode GE may correspond to a position of the channel region of the semiconductor layer SCL. For example, the gate electrode GE may be disposed on the channel region of the semiconductor layer SCL with the gate insulating film GI interposed therebetween.

The first interlayer insulating film ILD1 may be disposed on the gate electrode GE. Like the gate insulating film GI, the first interlayer insulating film ILD1 may include at least one of a silicon nitride (SiNx), a silicon oxide (SiOx), a silicon oxynitride (SiOxNy), and an aluminum oxide (AlOx).

The source electrode SE and the drain electrode DE may be formed through the first interlayer insulating film ILD1. The source electrode SE may pass through the gate insulating film GI and the first interlayer insulating film ILD1 to contact the first contact region of the semiconductor layer SCL, and the drain electrode DE may pass through the gate insulating film GI and the first interlayer insulating film ILD1 to contact the second contact region of the semiconductor layer SCL.

The second interlayer insulating film ILD2 may be formed such that the source electrode SE and the drain electrode DE are formed through the second interlayer insulating film ILD2. Like the first interlayer insulating film ILD1 and the gate insulating film GI, the second interlayer insulating film ILD2 may include an inorganic material. The inorganic material may include at least one of the first interlayer insulating film ILD1 and the gate insulating film GI, for example, a silicon nitride (SiNx), a silicon oxide (SiOx), a silicon oxynitride (SiOxNy) and an aluminum oxide AlOx. In some embodiments, the second interlayer insulating film ILD2 may include an organic material.

The power line PL may be disposed on the second interlayer insulating film ILD2. A power source may be supplied to the power line PL, and the supplied power source may be provided to the second connection wire CNL2 through the second contact hole CH2 electrically connected to the power line PL.

The passivation film PSV may be disposed on the second interlayer insulating film ILD2. The passivation film PSV may cover the power line PL. The passivation film PSV may include an organic insulating film, an inorganic insulating film, or a combination thereof, for example, such as an organic insulating film disposed on an inorganic insulating film.

The first contact hole CH1 electrically connected to the drain electrode DE and the second contact hole CH2 electrically connected to the power line PL may be formed through the passivation film PSV.

The display element portion DPL may include a first bank BNK1, the first electrode ELT1, the second electrode ELT2, a first insulating film INS1, the light emitting element LD, the first contact electrode CNE1, the second contact electrode CNE2, a second insulating film INS2, a second bank BNK2, and a third insulating film INS3.

The first bank BNK1 may have a shape protruding in an upper direction, and the first electrode ELT1 and the second electrode ELT2 may be arranged on the first bank BNK1, so that a reflective partition wall may be formed. The reflective partition wall may be formed to increase the light efficiency of the light emitting element LD.

A portion of the first electrode ELT1 may be arranged on the passivation film PSV, and another portion of the first electrode ELT1 may be arranged on the first bank BNK1. The first electrode ELT1 may include a path through which electrical information on the light emitting element LD applied through the first connection wire CNL1 may be provided. A portion of the second electrode ELT2 may be arranged on the passivation film PSV, and another portion of the second electrode ELT2 may be arranged on the first bank BNK1. The second electrode ELT2 may include a path through which electrical information on the light emitting element LD applied through the second connection wire CNL2 may be provided.

The first insulating film INS1 may be disposed on the passivation film PSV. Like the second interlayer insulating film ILD2, the first insulating film ILD1 may include at least one of a silicon nitride (SiNx), a silicon oxide (SiOx), a silicon oxynitride (SiON), and an aluminum oxide (AlOx).

At least a portion of the first insulating film INS1 may be disposed on the first electrode ELT1, and/or the second electrode ELT2, thereby stabilizing the electrical connection and reducing external influences.

The light emitting element LD may be disposed on the first insulating film INS1. According to the embodiment, the first insulating film INS1 may have a groove, at least a portion of the light emitting element LD may contact an end portion formed from the groove, and another portion of the light emitting element LD may contact another end portion formed from the groove.

The light emitting element LD may be disposed on the first insulating film INS1 between the first electrode ELT1 and the second electrode ELT2. The light emitting element LD may be substantially the same as the light emitting element LD described above with reference to FIG. 1 and FIG. 2.

The second insulating film INS2 may be disposed on the light emitting element LD. The second insulating film INS2 may be formed to cover a region corresponding to the active layer 12 (see FIG. 2) of the light emitting element LD. The second insulating film INS2 may include at least one of an organic material or an inorganic material.

In some embodiments, at least a portion of the second insulating film INS2 may be disposed on a rear surface of the light emitting element LD. The second insulating film INS2 formed on the rear surface of the light emitting element LD may fill a gap between the first insulating film INS1 and the light emitting element LD while the second insulating film INS2 is formed on the light emitting element LD.

The first contact electrode CNE1 and the second contact electrode CNE2 may be disposed on the first insulating film INS1. The first contact electrode CNE1 and the second contact electrode CNE2 may be electrically connected to the first electrode ELT1 and the second electrode ELT2, respectively, through contact holes formed in the first insulating film INS1.

The first contact electrode CNE1 and the second contact electrode CNE2 may include at least one of conductive materials including an indium tin oxide (ITO), an indium zinc oxide (IZO), and an indium tin zinc oxide (ITZO).

An electrical signal provided through the first electrode ELT1 may be provided to the light emitting element LD through the first contact electrode CNE1, and the light emitting element LD may emit light based on the provided electrical signal. An electrical signal provided through the second electrode ELT2 may be provided to the light emitting element LD through the second contact electrode CNE2.

The second bank BNK2 may have a structure defining a light emitting area of the pixel PXL. The light emitting area may mean an area in which light is emitted from the light emitting element LD. For example, the second bank BNK2 may be disposed in a boundary area between adjacent light emitting elements LD so as to surround the light emitting element LD of the pixel PXL.

The third insulating film INS3 may be arranged on the second bank BNK2, the first contact electrode CNE1, the second contact electrode CNE2, and the second insulating film INS2. The third insulating film INS3 may include one of an organic material and an inorganic material. The third insulating film INS3 may protect the display element portion DPL from external influences.

The arrangement relationship related to the light emitting element LD and the electrode configuration is not limited to the embodiment described above with reference to FIG. 4, and an arrangement relationship according to various changeable embodiments may be implemented.

Hereinafter, a manufacturing method of a display device according to an embodiment will be described with reference to FIG. 6 to FIG. 11.

Figure 6:
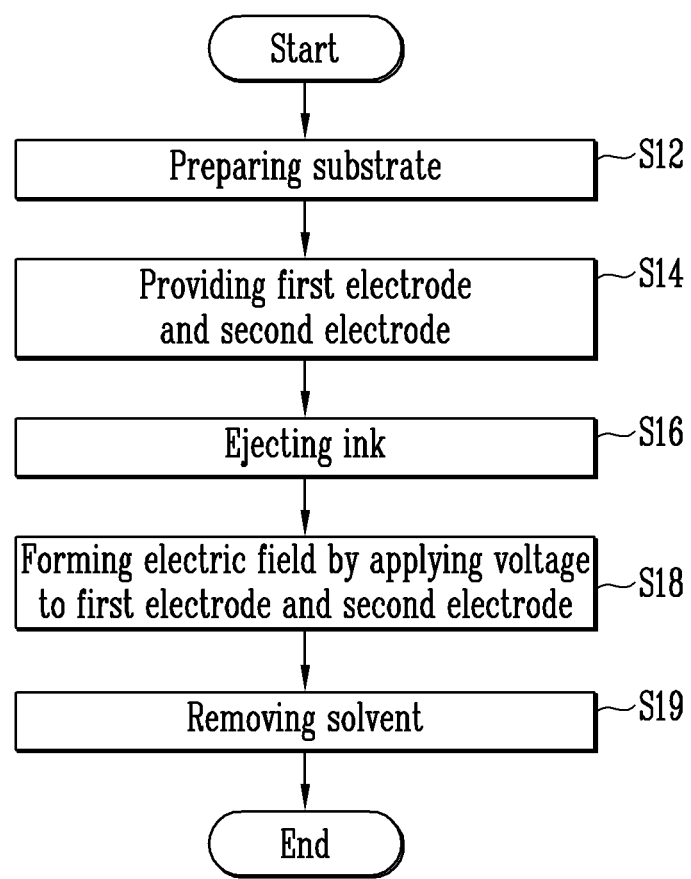
FIG. 6 illustrates a flowchart of a method of manufacturing a display device according to an embodiment.
Figure 7:
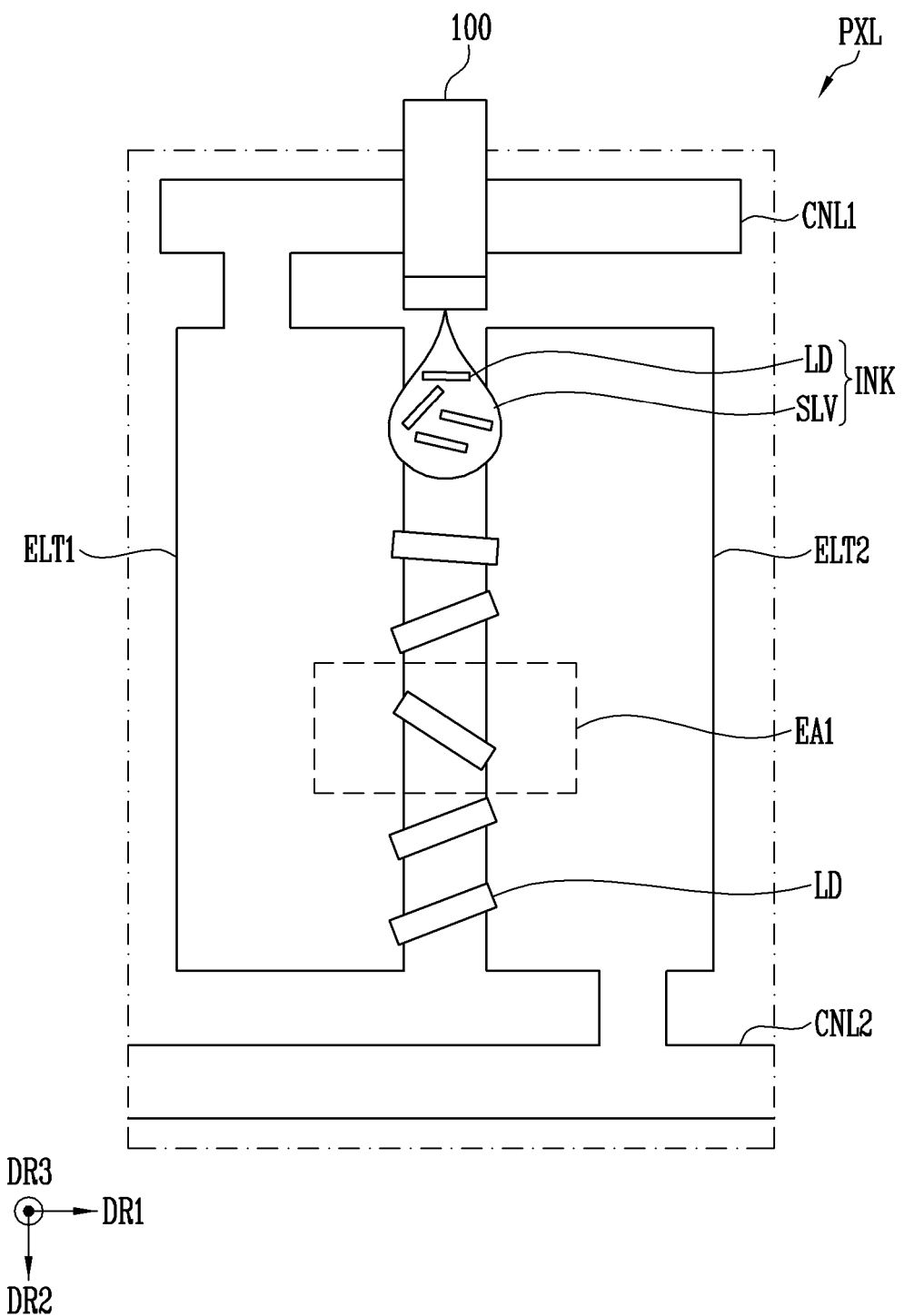
FIGS. 7 and 10 illustrate schematic top plan views of a specific time point during a process step of a manufacturing method according to an embodiment.
Figure 8:
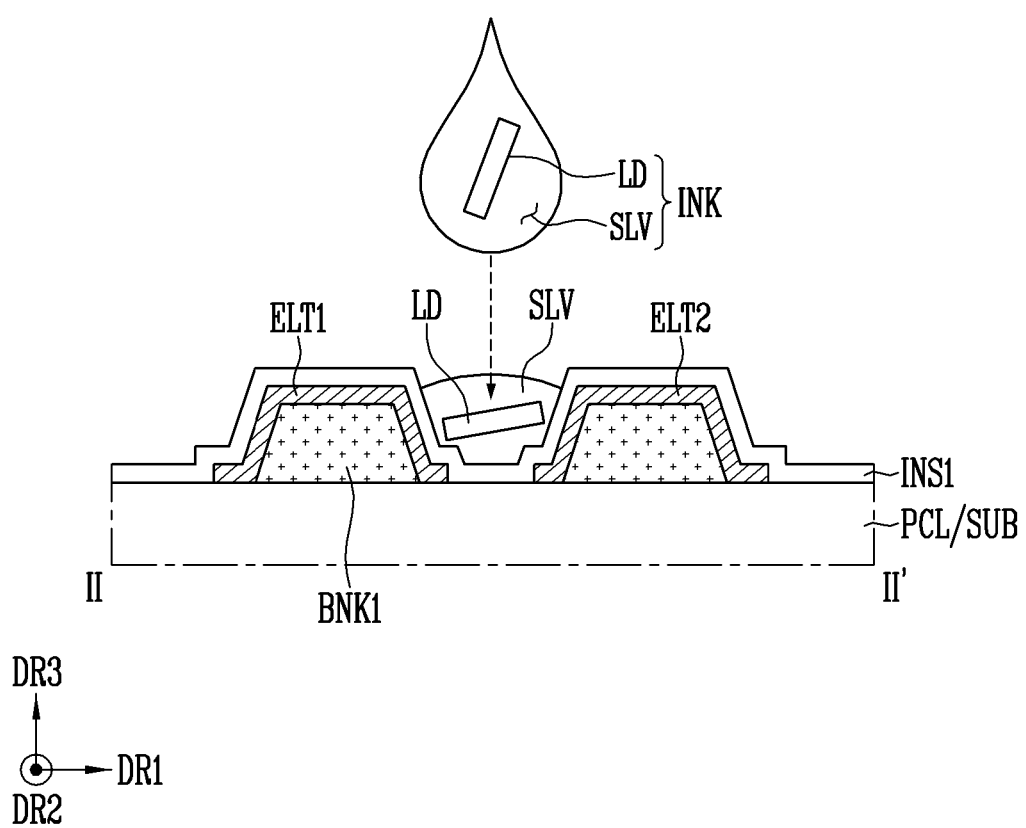
FIG. 8 and FIG. 11 illustrate schematic cross-sectional views taken along line II-II' of FIG. 4.
Figure 9:
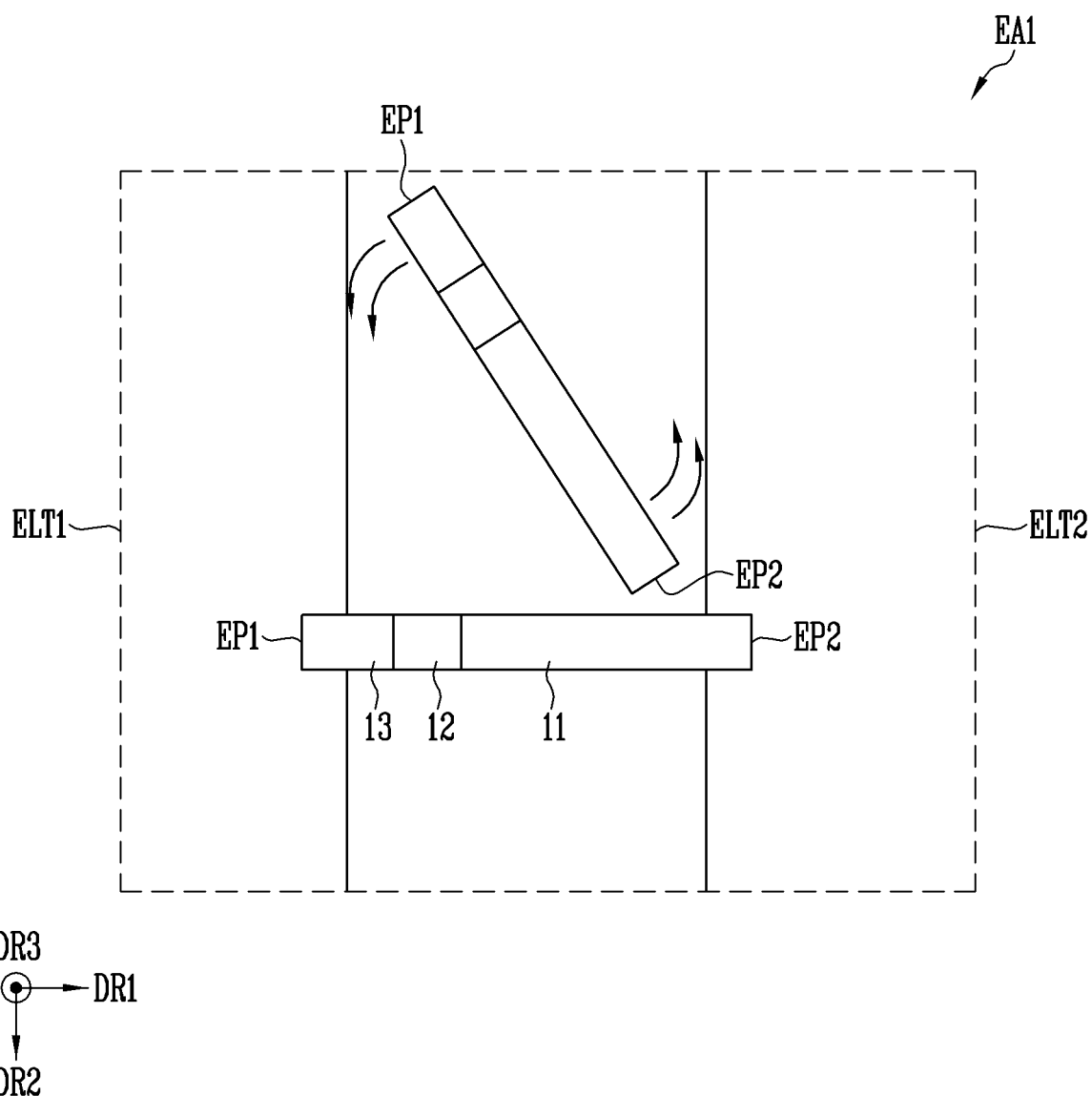
FIG. 9 illustrates an enlarged view of EA1 of FIG. 7.
Figure 10:
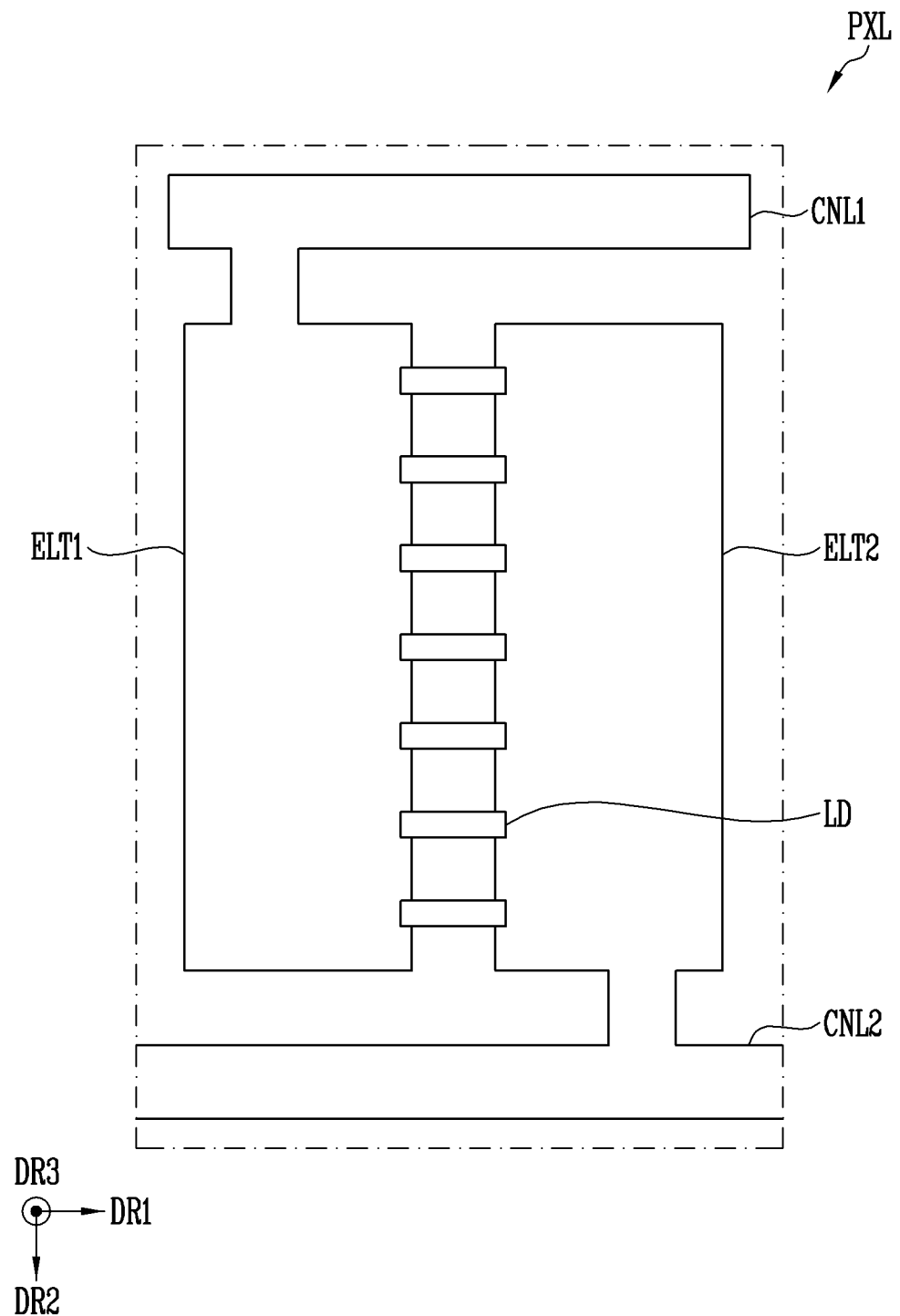
Figure 11:
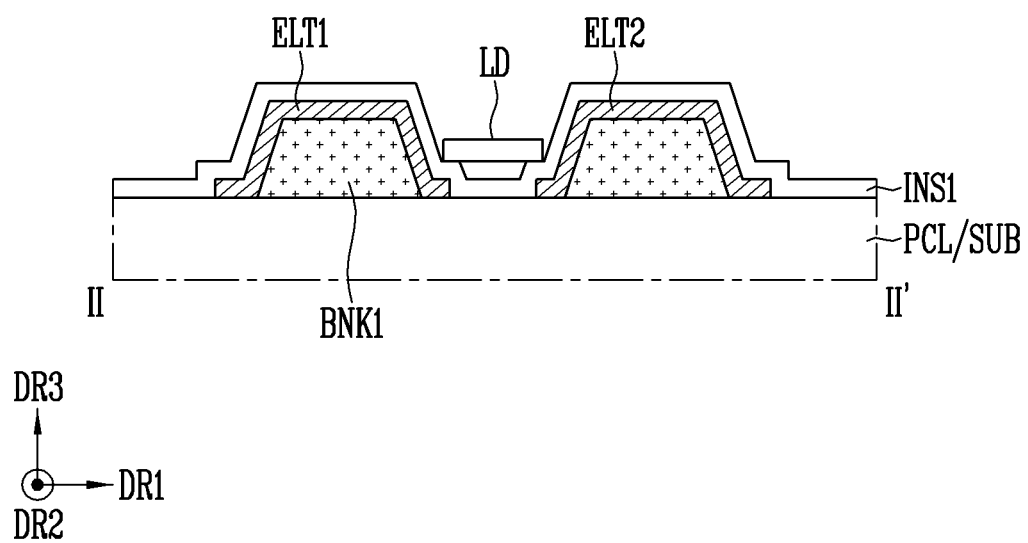

FIG. 6 illustrates a flowchart of a manufacturing method of a display device according to an embodiment. FIG. 7 and FIG. 10 illustrate top plan views of a pixel at a specific time point during a process step of a manufacturing method of a display device according to an embodiment. FIG. 8 and FIG. 11 illustrate schematic cross-sectional views taken along line II-II' of FIG. 4. FIG. 9 illustrates an enlarged view of EA1 of FIG. 7.

Referring to FIG. 6, a manufacturing method of a display device according to an embodiment may include preparing a substrate (S12); forming a first electrode and a second electrode (S14); spraying an ink (S16); forming an electric field by applying a voltage to the first electrode and the second electrode (S18); and removing a solvent (S19).

In preparing a substrate (S12), the substrate SUB may be prepared, and the pixel circuit portion PCL may be disposed on the substrate SUB. The substrate SUB may be substantially the same as the substrate SUB described above with reference to FIG. 5. Individual components of the pixel circuit portion PCL disposed on the substrate SUB may be formed by patterning a conductive layer (or metal), an inorganic material, or an organic material, by performing a process using a mask.

In forming a first electrode and a second electrode (S14), the first electrode ELT1 and the second electrode ELT2 may be provided on the substrate SUB. The first electrode ELT1 and the second electrode ELT2 may be disposed on the pixel circuit portion PCL. According to the embodiment, the first electrode ELT1 and the second electrode ELT2 may be disposed on the passivation film PSV of the pixel circuit portion PCL. In some embodiments, before the present step is performed, the first bank BNK1 may be provided on the pixel circuit portion PCL, and the first electrode ELT1 and the second electrode ELT2 may be disposed on the first bank BNK1.

Referring to FIG. 7 and FIG. 8, in spraying an ink (S16), an ink INK may be sprayed. The ink INK may be provided, for example, by a printing device 100 that ejects a liquid fluid. The printing device 100 may include a nozzle portion that discharges a liquid fluid to the outside. The ink INK defined in the specification may include a liquid mixture that may be outputted by the printing device 100.

In the present step, the printing device 100 may eject the ink INK while moving in the second direction DR2 with respect to an area in which the light emitting element LD is to be arranged. At least portion of the ejected ink INK may be positioned between the first electrode ELT1 and the second electrode ELT2.

Referring to FIGS. 7 and 8, the ink INK may include a solvent SLV and a light emitting element LD. Light emitting elements LD may be dispersed in the solvent SLV having fluidity. The solvent SLV may include a material of non-solid phase so that the light emitting elements LD may be prepared with being dispersed therein.

According to the embodiment, the ink INK may have an electrical conductivity less than a predetermined value. Contents regarding physical characteristics of the ink INK will be described later, and duplicate descriptions will be omitted.

In forming an electric field (S18), an electric field may be formed between the first electrode ELT1 and the second electrode ELT2. In the present step, an electric field may be formed between the first electrode ELT1 and the second electrode ELT2 by applying an alignment signal to each of the first electrode ELT1 and the second electrode ELT2, and the light emitting elements LD included in the ink INK may be aligned between first electrode ELT1 and second electrode ELT2 due to the formed electric field. In the present step, an alternating current signal may be applied to the first electrode ELT1 and the second electrode ELT2 so that the light emitting element LD is biased and aligned between the first electrode ELT1 and the second electrode ELT2. According to the embodiment, the alternating current signal may include a sine wave, a triangle wave, a staircase wave, a square wave, a trapezoid wave, a pulse wave, or a combination thereof, but is not limited thereto, and may be various alternating current signals.

Referring to FIG. 10 and FIG. 11, in forming an electric field (S18), the light emitting elements LD may be arranged so that length direction thereof is substantially parallel to the first direction DR1. The light emitting elements LD may be arranged to be substantially parallel to each other in the second direction DR2.

In an embodiment, the light emitting elements LD may be arranged to satisfy a predetermined (or specific) condition. First, the light emitting elements LD may be arranged in a central area between the first electrode ELT1 and the second electrode ELT2. As described above, the light emitting element LD is arranged between the first electrode ELT1 and the second electrode ELT2 to emit light when an electrical signal is applied thereto. In order to increase light emitting efficiency of the light emitting element LD and to reduce a process cost, a ratio of the light emitting elements LD in the ink INK arranged between the first electrode ELT1 and the second electrode ELT2 may be relatively high. The light emitting elements LD may be biased aligned. The biased alignment of the light emitting element LD may mean an alignment state in which a ratio at which an end portion of the light emitting element LD is arranged in the electrode configuration is more dominant than a ratio at which another end portion of the light emitting element LD is arranged in the electrode configuration.

When the light emitting elements LD are not bias-aligned, the light emitting efficiency of the display device may be lowered. The light emitting element LD may emit light based on a first electrical signal and a second electrical signal, where the first electrical signal is received from the first electrode ELT1 and provided through the first contact electrode CNE1, and the second electrical signal is received from the second electrode ELT2 and provided through the second contact electrode CNE2. An electrical flow may be generated in a predetermined direction between the first electrical signal and the second electrical signal, and thus, when the electrical flow flowing in the predetermined direction, and the direction of the light emitting element LD do not correspond to each other, the light emitting element LD that does not correspond thereto may not emit light. For example, in a current flow from the first electrode ELT1 to the second electrode ELT2, when the anode of the light emitting element LD contacts the first electrode ELT1 and the cathode of the light emitting element LD contacts the second electrode ELT2, the light emitting element LD may emit light. In contrast, when the cathode of the light emitting element LD contacts the first electrode ELT1 and the anode of the light emitting element contacts the second electrode ELT2, the light emitting element LD may not emit light. Thus, the light emitting element LD may be biased and aligned at a high ratio between the first electrode ELT1 and the second electrode ELT2, so that the light emitting efficiency of the display device may be increased.

As described above with reference to FIGS. 1 and 2, the light emitting element LD may include the first semiconductor layer 11, and the second semiconductor layer 13 different from the first semiconductor layer 11. Accordingly, the light emitting element LD may have electrical asymmetry based on a length direction thereof. For example, when the first end portion EP1 of the light emitting element LD has a positive charge property, the second end portion EP2 of the light emitting element LD may have a negative charge property. In another example, when the first end portion EP1 of the light emitting element LD has a negative charge property, the second end portion EP2 of the light emitting element LD may have a positive charge property.

According to the manufacturing method of the display device to which the ink INK according to the embodiment is applied, a high biased alignment ratio with respect to the light emitting element LD may be obtained. Hereinafter, the reason why a high biased alignment ratio is obtained when the ink INK according to the embodiment is used will be described with reference to FIG. 9. In the embodiment, the first end portion EP1 of the light emitting element LD is connected to the first electrode ELT1, and the second end portion EP2 of the light emitting element LD is connected to the second electrode ELT2 such that the light emitting element LD may emit light.

However, the connection between the light emitting element LD and the first and second electrodes ELT1 and ELT2 is not limited thereto, and in some embodiments, the second end portion EP2 of the light emitting element LD may be connected to the first electrode ELT1, and the first end portion EP1 of the light emitting element LD may be connected to the second electrode ELT2.

Referring to FIG. 9, the first end portion EP1 of the light emitting element LD may have a positive charge, and the second end portion EP2 of the light emitting element LD may have a negative charge. This may be because the first semiconductor layer 11 is implemented as an N-type semiconductor and the second semiconductor layer 13 is implemented as a P-type semiconductor, so that the first semiconductor layer 11 has an electrically negative property compared to the second semiconductor layer 13.

In forming an electric field (S18), an electric field from the second electrode ELT2 to the first electrode ELT1 may be formed. As described above, at least a portion of the light emitting element LD may have electrical properties, and external force may be applied to at least a portion of the light emitting element LD. In this case, the external force applied to the light emitting element LD may be Lorentz force. Hereinafter, a direction from the second electrode ELT2 to the first electrode ELT1 is defined as a first alignment direction, and a direction from the first electrode ELT1 to the second electrode ELT2 is defined as a second alignment direction.

For example, the first end portion EP1 of the light emitting element LD may have a positive charge, and due to the electric field formed in the first alignment direction, the first end portion EP1 of the light emitting element LD may be applied with external force directed in the first alignment direction. The second end portion EP2 of the light emitting element LD may have a negative charge, and due to the electric field formed in the first alignment direction, the second end portion EP2 of the light emitting element LD may be applied with external force directed in the second alignment direction.

Due to the external force of different directions applied to an end portion and another end portion of the light emitting element LD, rotation torque applied so that the first end portion EP1 of the light emitting element LD is directed to the first electrode ELT1 may be generated. Similarly, rotation torque applied so that the second end portion EP2 of the light emitting element LD is directed to the second electrode ELT2 may be generated. Accordingly, when the length direction of the light emitting element LD is taken as a reference, due to different charge values for each position, external force (for example, rotation torque) may be generated that causes the light emitting element LD to be arranged in a "specific direction", and as a result, the light emitting element LD included in the ink INK may be biased and aligned in the "specific direction".

When the length direction of the light emitting element LD is taken as a reference, and when a deviation of a charge amount for each position is large, for example, as a difference of the charge amount between the first end portion EP1 of the light emitting element LD and the second end portion EP2 of the light emitting element LD increases, a value of the rotation torque to be arranged in the specific direction may increase, and thus, the biased alignment for the light emitting element LD may be more strongly generated.

According to the embodiment, the electrical conductivity of the ink INK may be less than or equal to a predetermined numerical range. For example, the electrical conductivity of the ink INK according to the embodiment may be about 1.5 µS/m or less. In another example, the electrical conductivity of the ink INK according to the embodiment may be about 1.0 µS/m or less. In another example, the electrical conductivity of the ink INK according to the embodiment may be about 0.8 µS/m or less.

When the electrical conductivity of the ink INK is less than or equal to the predetermined value, a difference in charge amount between the first end portion EP1 and the second end portion EP2 of the light emitting element LD may be further increased when an electric field is formed.

When the electrical conductivity of the ink INK is high, an electrical signal may be actively transmitted in the fluid in the ink INK, for example, electrical information (for example, free electrons) positioned at an end portion of the light emitting element LD may be easily transmitted to another end portion of the light emitting element LD. Even when the difference in charge amount between respective end portions of the light emitting element LD is large, the difference in charge amount between respective end portions of the light emitting element LD may be reduced due to the high electrical conductivity of the ink INK.

In contrast, when the electrical conductivity of the ink INK is less than or equal to the predetermined value, an electrical signal may not be actively transmitted in the fluid in the ink INK. Accordingly, when the difference in charge amount between respective end portions of the light emitting element LD is large, large rotation torque may be generated in the light emitting element LD when an electric field is applied. Thus, the light emitting element LD may be more strongly biased and aligned, and accordingly, a light emitting efficiency of a display device may be increased, and further, a cost required to achieve a goal of the same light emitting efficiency may be reduced.

Thus, the light emitting element LD arranged between the first electrode ELT1 and the second electrode ELT2 may be biased and aligned. For example, in forming an electric field (S18), the light emitting element LD may include a first light emitting element in which the first end portion EP1 corresponds to the first electrode ELT1 and the second end portion EP2 corresponds to the second electrode ELT2, and a second light emitting element in which the first end portion EP1 corresponds to the second electrode ELT2 and the second end portion EP2 corresponds to the first electrode ELT1, and the number of the first light emitting elements may be larger than that of the second light emitting elements. In some embodiments, a ratio of the first light emitting element or the second light emitting element to the number of light emitting elements LD may be about 0.6 or more.

Referring back to FIG. 6, in removing a solvent (S19), the solvent SLV included in the ink INK may be removed. However, in some embodiments, a separate removal process for the solvent SLV is not performed, but the solvent SLV may be volatilized and removed. When the present step is performed, the position of the light emitting element LD may be stably arranged and fixed on the first insulating film INS1.

Although not shown in the drawing, by continuously performing an additional process, the second insulating film INS2, the first contact electrode CNE1, the second contact electrode CNE2, and the third insulating film INS3 that are described above with reference to FIG. 4 and FIG. 5 may be formed to manufacture the display device according to the embodiment.

Hereinafter, an embodiment of a manufacturing method of the ink INK provided in the manufacturing method of the display device according to the embodiment will be described.

First, the solvent SLV included in the ink INK is prepared, and the solvent SLV and the light emitting element LD are mixed. The solvent SLV may include at least one of acetyltributylcitrate, tributyl citrate, tris acetate phosphate, ethyl phthalyl ethyl glycolate, propylene glycol phenyl ether, propylene glycol methyl ether acetate, butyl carbitol acetate, and decanol. An electrical conductivity of the solvent SLV may be included in a predetermined numerical range so that an electrical conductivity of the ink INK satisfies a predetermined numerical range. The electrical conductivity of the solvent SLV may be substantially the same as that of the ink INK. For example, the electrical conductivity of the solvent SLV may be about 1.5 µS/m or less. In another example, the electrical conductivity of the solvent SLV may be about 1.0 µS/m or less. In another example, the electrical conductivity of the solvent SLV may be about 0.8 µS/m or less.

The light emitting element LD provided to the solvent SLV may have a concentration of about 0.01 to about 1 wt % with respect to a total weight of the ink INK. In some embodiments, a dispersant may be provided in the ink INK. The dispersant may have a concentration of about 10 to about 50 wt % with respect to the total weight of the ink INK. The dispersant may disperse the light emitting elements LD not to be aggregated in the ink INK. When the dispersant is provided in the ink INK, a physical operation may be performed on the ink INK so that the light emitting elements LD may be further dispersed. The physical operation may be at least one of sonication, stirring, and milling, but is not limited thereto.

When the light emitting elements LD included in the ink INK are dispersed from each other, an additive may be provided in the ink INK. The additive may adjust viscosity, surface tension, or the like of the ink INK so that the process related to the manufacturing method of the display device according to the embodiment may be smoothly performed. According to the embodiment, the additive may have a concentration of about 0.01 to about 1 wt % with respect to the total weight of the ink INK. When the additive is provided, sonication or stirring may be performed. In some embodiment, after the additive is provided, the sonication or stirring process may be performed at a temperature of about 40 degrees Celsius or higher, but is not limited thereto.

The ink INK may be provided while a process including the manufacturing method is performed. In some embodiments, each of the processes may be performed to prepare a first ink and a second ink, and the first ink and the second ink may be mixed to provide the ink INK, which is not limited thereto, and at least two or more inks may be mixed to provide the ink INK.

The ink INK may include the solvent SLV as described above. However, in some embodiments, the solvent SLV may include at least two or more solvents. For example, the solvent SLV may include a first solvent and a second solvent.

When the process related to the manufacturing method of the display device to which the ink INK is applied is performed, the ink INK may have additional physical characteristics (for example, viscosity, etc.) including viscosity other than the electrical conductivity. For example, in order for the electrical conductivity of the ink INK to satisfy a predetermined numerical range (or a specific viscosity range), the first solvent may be included in the ink INK, and at the same time, the viscosity of the ink INK needs to satisfy a predetermined numerical range (or a specific viscosity range). The viscosity of the first solvent may be excessively low, and thus, the viscosity characteristic of the ink INK may not satisfy the predetermined numerical range (or the specific viscosity range). According to the embodiment, the second solvent having a viscosity exceeding the predetermined numerical range (or the specific viscosity range) may be further included in the ink INK. Thus, the first solvent and the second solvent are mixed, and the viscosity of the ink INK may have a value corresponding to the predetermined numerical range (or the specific viscosity range). However, even when both the second solvent and the first solvent are included in the ink INK, the electrical conductivity of the ink INK needs to be within the predetermined numerical range (or the specific viscosity range). That is, the electrical conductivity of the second solvent has a very large value, and thus may not be included in the predetermined numerical range (or the specific viscosity range). However, by appropriately selecting the second solvent or by appropriately adjusting amounts of the first solvent and the second solvent, the first solvent and the second solvent may be mixed so that the electrical conductivity of the ink INK containing the first solvent and the second solvent may be included in at least the predetermined numerical range (or the specific viscosity range).

Hereinafter, when the ink INK according to the embodiment and an ink according to a comparative example are respectively applied, an experimental example of whether or not the light emitting element LD is biased and aligned will be described. In the experiment, when 60% or more of the light emitting elements LD included in the ink are biased and aligned in a predetermined direction, the biased alignment was recorded, and when less than 60% of the light emitting element LD included in the ink are biased and aligned in a predetermined direction, the non-biased alignment was recorded.

TABLE 1

| Electrical conductivity (µS/m) | Dielectric constant | Ink | Whether biased alignment |
|---|---|---|---|
| 0.004 | 5.42 | Embodiment | biased alignment |
| 0.19 | 7.0 | Embodiment | biased alignment |
| 0.33 | 7.17 | Embodiment | biased alignment |
| 0.84 | 7.04 | Embodiment | biased alignment |
| 2.06 | 9.55 | Comparative example | Unbiased alignment |
| 2.84 | 9.63 | Comparative example | Unbiased alignment |
| 6.69 | 8.58 | Comparative example | Unbiased alignment |
| 9.92 | 9.27 | Comparative example | Unbiased alignment |

Referring to Table 1, it can be confirmed that the biased alignment for the light emitting element LD was realized in the ink INK having the electrical conductivity of about 1.5 µS/m or less, particularly, the electrical conductivity of about 1.0 µS/m or less. In addition, it can be confirmed that the biased alignment for the light emitting element LD was realized in the ink INK having a dielectric constant of about 8.0 or less. In contrast, it can be seen that the biased alignment of the light emitting element LD was not realized in the ink to which the solvent having the electrical conductivity exceeding about 1.5 µS/m was applied, by a predetermined numerical range or more.

Consequently, according to the ink INK having the electrical conductivity of a predetermined numerical range, even when a separate process is not performed, the light emitting element LD may be biased aligned.

According to the conventional process, in order to realize biased alignment for the light emitting element LD, a process of applying energy to the light emitting element LD such as UV light irradiation or a process of applying a fine electrical signal to the light emitting element LD to be biased alignment has been performed. In these processes, when applying energy to the light emitting element LD, the position of the normally arranged light emitting element LD may be distorted in the process of applying the energy to the light emitting element LD, and when applying a fine electrical signal for the biased alignment, the process may be hard to perform and require excessive cost.

However, according to the embodiment, the light emitting efficiency of the display device may be increased, and since a separate process for biased alignment may not be required, a process may be simplified and thus a process cost may be reduced, and further it is possible to prevent conventional problems that occur due to being performed for biased alignment of the light emitting element LD.

The above description is merely illustrative of the technical spirit or scope of the invention, and a person of ordinary skill in the art will readily appreciate that various modifications and equivalent arrangements are possible without materially departing from the novel teachings and advantages of the invention. Therefore, the embodiments of the invention described above may be implemented separately or in combination with each other.

Therefore, the embodiments disclosed in the invention are not intended to limit the technical spirit or scope of the invention, but to explain them, and the range of the technical spirit or scope of the invention is not limited by the embodiments. The protection range of the invention should be construed by the claims below, and all technical ideas within an equivalent range thought should be construed as being included within the scope of the invention.

What is claimed is:

1. An ink for manufacturing a display device, comprising:
a first solvent; and
light emitting elements disposed in the first solvent, wherein
the light emitting elements include:
a first semiconductor layer including a first type of semiconductor; and
a second semiconductor layer including a second type of semiconductor, and
an electrical conductivity of the ink is about 1.5 µS/m or less.

2. The ink of claim 1, wherein the first solvent includes at least one of acetyltributylcitrate, tributyl citrate, tris acetate phosphate, ethyl phthalyl ethyl glycolate, propylene glycol phenyl ether, propylene glycol methyl ether acetate, butyl carbitol acetate, and decanol.

3. The ink of claim 1, further comprising a second solvent different from the first solvent.

4. The ink of claim 3, wherein
an electrical conductivity of the first solvent is smaller than that of the ink, and
an electrical conductivity of the second solvent is larger than that of the ink.

5. The ink of claim 1, wherein a dielectric constant of the ink is about 8.0 or less.

6. The ink of claim 1, wherein an electrical conductivity of the ink is about 1.0 µS/m or less.

7. The ink of claim 6, wherein an electrical conductivity of the ink is about 0.8 µS/m or less.

8. The ink of claim 1, wherein when an electric field is applied to the light emitting elements,
external force is applied to the first semiconductor layers of the light emitting elements in a first direction, and
external force is applied to the second semiconductor layers of the light emitting elements in a second direction different from the first direction.

9. A method of manufacturing a display device, comprising:
preparing a substrate;
forming a first electrode and a second electrode on the substrate;
disposing ink between the first electrode and the second electrode, wherein the ink includes a first solvent including a plurality of light emitting elements; and
forming an electric field between the first electrode and the second electrode, wherein an electrical conductivity of the ink is about 1.5 μS/m or less.

10. The method of claim 9, wherein, in the forming of the electric field, the plurality of light emitting elements are arranged between the first electrode and the second electrode.

11. The method of claim 9, wherein
each of the plurality of light emitting elements include a first end portion opposite a second end portion a first semiconductor layer disposed adjacent to the first end portion, and a second semiconductor layer disposed adjacent to the second end portion, and
a polarity of each of the light emitting elements at the first end portion is different from a polarity of each of the light emitting elements at the second end portion.

12. The method of claim 11, wherein, in the forming of the electric field,
external force toward a first electrode is applied to the first end portion, and
external force toward the second electrode is applied to the second end portion.

13. The method of claim 11, wherein, in the forming of the electric field, each of the plurality of light emitting elements rotate so that the first end portion faces to the first electrode and the second end portion faces to the second electrode in a plan view.

14. The method of claim 11, wherein
the plurality of light emitting elements include at least one first light emitting element and at least one second light emitting element,
in the forming of the electric field, a first end portion of the at least one first light emitting element corresponds to the first electrode, a second end portion of the at least one first light emitting element corresponds to the second electrode, a first end portion of the at least one second light emitting element corresponds to the second electrode, and a second end portion of the at least one second light emitting element corresponds to the first electrode, and
a number of the at least one first light emitting element wants is larger than a number of the at least one second light emitting element.

15. The method of claim 14, wherein a ratio of the at least one first light emitting element to the plurality of light emitting elements is about 0.6 or more.

16. The method of claim 9, wherein the first solvent includes at least one of acetyltributylcitrate, tributyl citrate, tris acetate phosphate, ethyl phthalyl ethyl glycolate, propylene glycol phenyl ether, propylene glycol methyl ether acetate, butyl carbitol acetate, and decanol.

17. The method of claim 11, wherein
the ink further includes a second solvent different from the first solvent,
an electrical conductivity of the first solvent is smaller than the electrical conductivity of the ink, and
an electrical conductivity of the second solvent is larger than the electrical conductivity of the ink.

18. The method of claim 9, wherein an electrical conductivity of the ink is about 1.0 μS/m or less.

19. The method of claim 9, further comprising:
removing the first solvent after the forming of the electric field.

* * * * *